United States Patent [19]

Murphy

[11] Patent Number: 5,277,770
[45] Date of Patent: * Jan. 11, 1994

[54] REGENERATING A PLASMA INITIATOR USING OXYGEN-CONTAINING GAS IN THE PRESENCE OF MICROWAVE RADIATION

[75] Inventor: William J. Murphy, Brights Grove, Canada

[73] Assignee: Exxon Research & Engineering Co., Florham Park, N.J.

[ * ] Notice: The portion of the term of this patent subsequent to Dec. 4, 2007 has been disclaimed.

[21] Appl. No.: 695,114

[22] Filed: May 3, 1991

Related U.S. Application Data

[63] Continuation of Ser. No. 457,427, Dec. 27, 1989, abandoned.

[51] Int. Cl.$^5$ ............................................. B01J 19/08
[52] U.S. Cl. ........................ 204/157.43; 204/157.15; 204/158.2; 502/5
[58] Field of Search ............... 204/156, 158.2, 157.43, 204/158.2, 157.15; 502/5

[56] References Cited

U.S. PATENT DOCUMENTS

| | | | |
|---|---|---|---|
| 4,144,189 | 3/1979 | Kirkbride | 204/157.15 |
| 4,574,038 | 3/1986 | Wan | 204/157.15 |
| 4,975,164 | 12/1990 | Ravella et al. | 204/156 |

Primary Examiner—W. Gary Jones
Assistant Examiner—Dean Tan Nguyen
Attorney, Agent, or Firm—John W. Ditsler; James H. Takemoto

[57] ABSTRACT

Plasma initiators that have become deactivated due to the accumulation of carbonaceous deposits, sulfur deposits, or both thereon can be regenerated by contact with an oxygen-containing gas in the presence of microwave radiation.

20 Claims, 2 Drawing Sheets

REGENERATING A PLASMA INITIATOR USING OXYGEN-CONTAINING GAS IN THE PRESENCE OF MICROWAVE RADIATION

This is a continuation of application Ser. No. 457,427, filed Dec. 27, 1989, now abandoned.

BACKGROUND OF THE INVENTION

1. Field of the Invention

This invention relates to a method for regenerating a plasma initiator using an oxygen-containing gas.

2. Description of Related Art

Microwave energy has been used to convert methane to other hydrocarbons. For example, U.S. Pat. No. 4,574,038 discloses that methane can be converted to ethylene and hydrogen in a batch process at pressures of from 0.3 to 1 atmosphere by subjecting the methane to microwave radiation in the presence of a metal powder catalyst. Another example of methane conversion using microwave energy is U.S. Pat. No. 3,663,394.

Microwave energy has also been used to treat liquid hydrocarbons. For example, U.S. Pat. No. 3,616,375 discloses a method of decreasing the sulfur content of crude oil and other petroleum products using microwave energy. As another example, U.S. Pat. No. 4,234,402 discloses that a variety of petroleum products can be hydrogenated and desulfurized by contact with hydrogen and microwave energy. As yet another example, U.S. Pat. No. 4,279,722 discloses that a number of petroleum refinery operations can be improved by subjecting the hydrocarbon reactants and catalysts to microwave energy. In addition, German Patent 2,535,119 discloses a method for conducting chemical reactions by subjecting a catalyst particle in a fluid medium containing the chemical reagents to microwave energy.

However, none of these patents suggest the regeneration process described below.

SUMMARY OF THE INVENTION

This invention concerns a method for regenerating a plasma initiator. More specifically, one or more plasma initiators that have become at least partially deactivated due to the accumulation of carbonaceous deposits, sulfur deposits, or both thereon can be regenerated by contacting the initiator with an oxygen-containing gas for a period of time sufficient to remove at least a portion of the deposits from the initiator. In a preferred embodiment, regeneration is effected in the presence of microwave radiation.

DETAILED DESCRIPTION OF THE INVENTION

Figure 1:
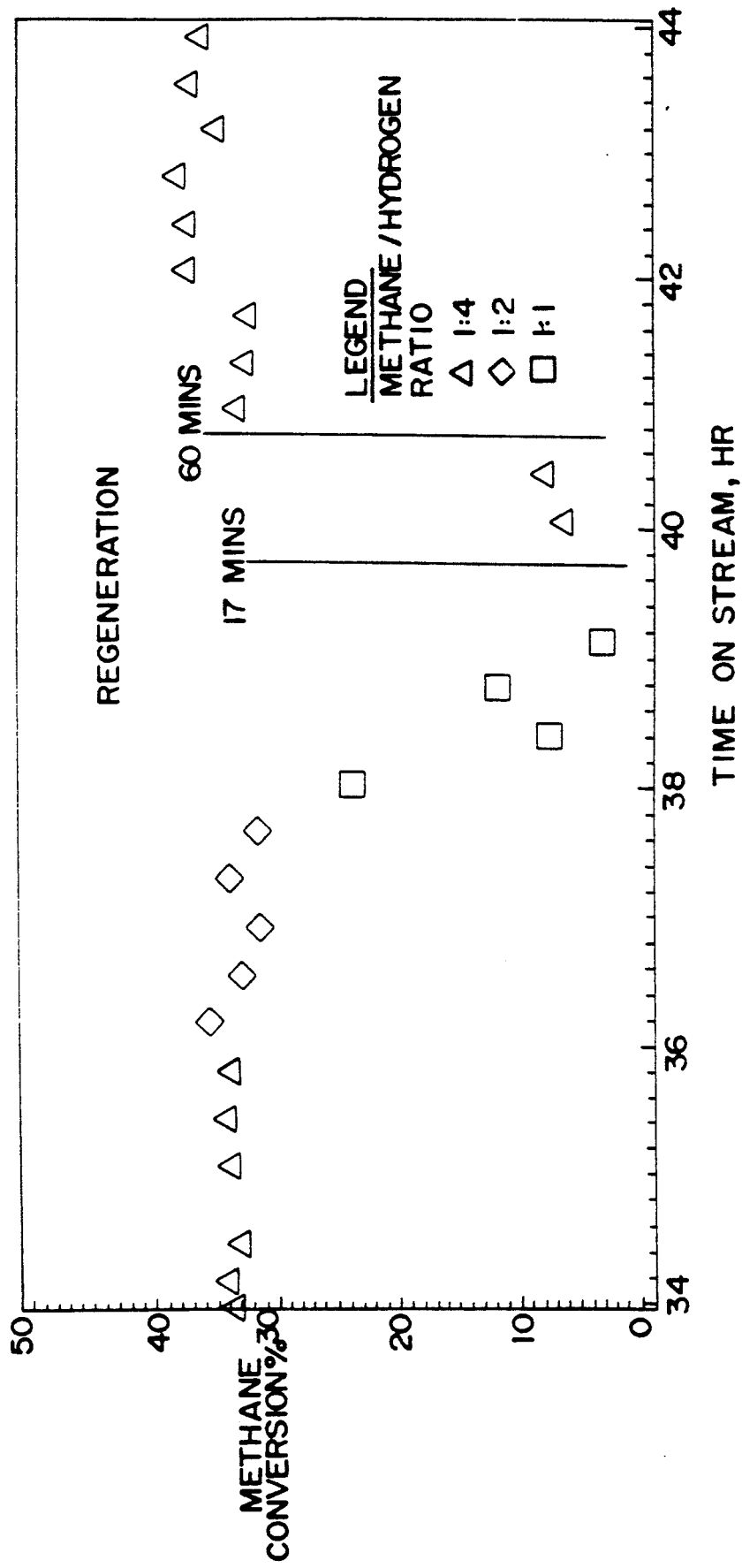
FIG. 1 is a graph of methane conversion versus time which shows the regeneration of an iron wire plasma initiator using an air/helium mixture.

Copending patent applications U.S. Ser. Nos. 457,426 and 457,428 both filed on the same date herewith, now abandoned, disclose the conversion of methane using microwave energy in the presence of at least one plasma initiator. However, during conversion, the initiator becomes at least partially deactivated due to the formation of carbonaceous deposits thereon, such that methane conversion will decrease with time. Similarly, deposits of sulfur could accumulate on the initiator during reaction of sulfur-containing non-hydrocarbon compounds (e.g. the dissociation of $H_2S$, dimethyl sulfide, or other sulfur containing materials).

I have found that the activity of a plasma initiator to methane conversion can be at least partially restored (i.e. regenerated) by contacting the initiator with an oxygen-containing gas for a period of time sufficient to remove (i.e. burn) at least a portion (preferably at least all) of the carbonaceous deposits, sulfur deposits, or both from the initiator. The precise contact time required to regenerate the initiator will vary broadly depending on the amount of carbon or sulfur present, the oxygen concentration of the gas, and the like. For example, the contact time can vary from a few minutes or less to 12 hours or more. Typically, however, the contact time will vary from about 15 minutes to about 6 hours, preferably from about 30 minutes to about 2 hours.

Similarly, the oxygen concentration in the oxygen-containing gas can vary broadly. For example, the oxygen concentration can vary from 0.5 mole % or less to 30 mole % or more. Typically, however, the oxygen concentration will range from about 2 to about 20 mole %.

The oxygen-containing gas used in this invention can be essentially any gas containing oxygen that can remove carbonaceous deposits, sulfur deposits, or both from a plasma initiator. Suitable oxygen-containing gases include air, $CO_2$, ozone, $O_2$, $H_2O$, or mixtures therefore. A diluent such as nitrogen or helium may be present in the oxygen-containing gas as well.

The plasma initiator regenerated according to this invention is essentially any material capable of accumulating an electric charge when placed in an electromagnetic field and then dissipating the charge (or initiating an electric discharge), for example, by ionizing a gas environment. This includes metal initiators, non-metal initiators (including semiconductors), and composites of metal and non-metal initiators. As used herein, "composite" is meant to include mixtures (or combinations) of metals and non-metals. Examples of suitable metal initiators are tungsten, iron, nickel, copper, their alloys, or mixtures thereof. Preferred metal initiators are tungsten, iron, or mixtures thereof. Examples of suitable non-metal initiators include carbon, alumina, manganese dioxide, magnetite, nickel oxide (e.g. NiO), iron oxide (e.g. $Fe_3O_4$), calcium aluminate, cobalt oxide, chromium nitride, iron sulfide (e.g. $FeS_2$, $Fe_{1-x}S$) copper sulfide (e.g. $Cu_2S$) or mixtures thereof. Carbon, iron oxide, and calcium aluminate are preferred, with carbon being particularly preferred. Silica is not a suitable non-metal initiator. However, silica composited with a metal initiator or another non-metal initiator would be a suitable plasma initiator.

Each plasma initiator should be elongated, but may be formed, combined, or bent in any convenient shape (e.g. straight, helix, spiral, and the like). Preferably, each initiator should be formed such that there are points or sharp edges at the ends or on the surface of each initiator.

The regeneration process of this invention preferably occurs (but need not occur) in the presence of microwave energy. The frequency of the microwave source can vary broadly. Typically, however, the microwave energy will have a frequency of at least 0.3 GHz, with frequencies centered around 0.915, 2.45, 5.80, or 22.0

GHz being presently preferred in North America; particularly frequencies centered around 0.915, 2.45, or 5.80 GHz; especially frequencies centered around 0.915 or 2.45 GHz.

The microwave energy may be continuous or pulsed. If pulsed, the duration of on-time pulses can vary broadly, but typically will range from about 1 nanosecond to about 20 seconds, preferably from about 1 millisecond to about 10 seconds, and most preferably from about 0.01 to about 0.2 seconds. The duration of off-time rests can vary broadly as well, but typically will range from about 1 nanosecond to about 100 seconds, preferably from about 0.003 to about 60 seconds, and most preferably from about 0.3 to about 5 seconds.

Although this invention has been described above with respect to the formation of carbonaceous deposits from converting methane, these deposits (or for that matter the sulfur deposits) could have originated from any reactions that would form such deposits.

When microwave radiation is used, the regeneration process of this invention can be practiced at any convenient temperature and pressure, including ambient conditions, although elevated temperature and pressure may be used if desired. However, if microwave radiation is not used, the regeneration should be conducted at a temperature of at least 350° C., more typically at least 400° C., to remove the deposits.

This invention will be further understood by reference to the following Examples which are not intended to restrict the scope of the appended claims.

EXAMPLE 1

Regeneration of Iron Wire Using an Air/Helium Mixture

A methane/hydrogen mixture (1:4 mole ratio) flowing at 25 ml/min (milliliters/min) at atmospheric pressure was contacted with 2.9 gm of iron wire (about 0.03 inches in diameter and cut into 45 mm lengths) in a reactor fabricated from WR430 waveguide bounded by quartz plate glass windows and positioned approximately one-quarter waveguide wavelength from a short circuit plate. The reactor was irradiated with microwave radiation centered at a 2.45 GHz frequency and pulsed in an on/off cycle (0.14 seconds on in a total cycle of 3.5 seconds) with an average power ranging from 7.5 to 10 watts. The methane/hydrogen mole ratio was then decreased from 1:4 to 1:1, with the methane conversion being calculated according to the following equation:

$$\begin{matrix}\% \text{ Methane} \\ \text{Conversion}\end{matrix} = \left[ 1 - \frac{\text{wt \% methane in the products}}{\text{wt \% methane in the feed}} \right] \times 100$$

The results (as illustrated in FIG. 1) show that a reduction of the methane/hydrogen mole ratio from 1:4 to 1:2 had little effect on methane conversion. However, a further reduction to 1:1 resulted in a significant decrease in methane conversion (to less than 5%). In addition, carbonaceous deposits were observed to have accumulated on the iron wires as the mole ratio decreased.

At this point, the methane/hydrogen flow was stopped and the reactor purged with helium flowing at about 100 ml/min at atmospheric pressure. Air (10 ml/min) was then introduced into the reactor with the helium and the initiators irradiated with pulsed microwave radiation centered at a 2.45 GHz frequency in an on/off cycle (0.5 seconds on in a total cycle of 3.5 seconds) for 17 minutes. As shown in FIG. 1, methane conversion using a methane/hydrogen mixture (1:4 mole ratio) flowing at 25 ml/min showed only marginal improvement in conversion (from less than 5% to about 8%).

The methane/hydrogen flow was again replaced by helium, the reactor purged, and the above air/helium regeneration repeated with the exception that the time was extended to 60 minutes. Flow of the methane/hydrogen mixture (1:4 mole ratio at 25 ml/min) was reinitiated and the methane conversion calculated as above. FIG. 1 shows that the methane conversion was almost the same as that before deactivation.

EXAMPLE 2

Regeneration of Tungsten Wire Using Air

Figure 2:
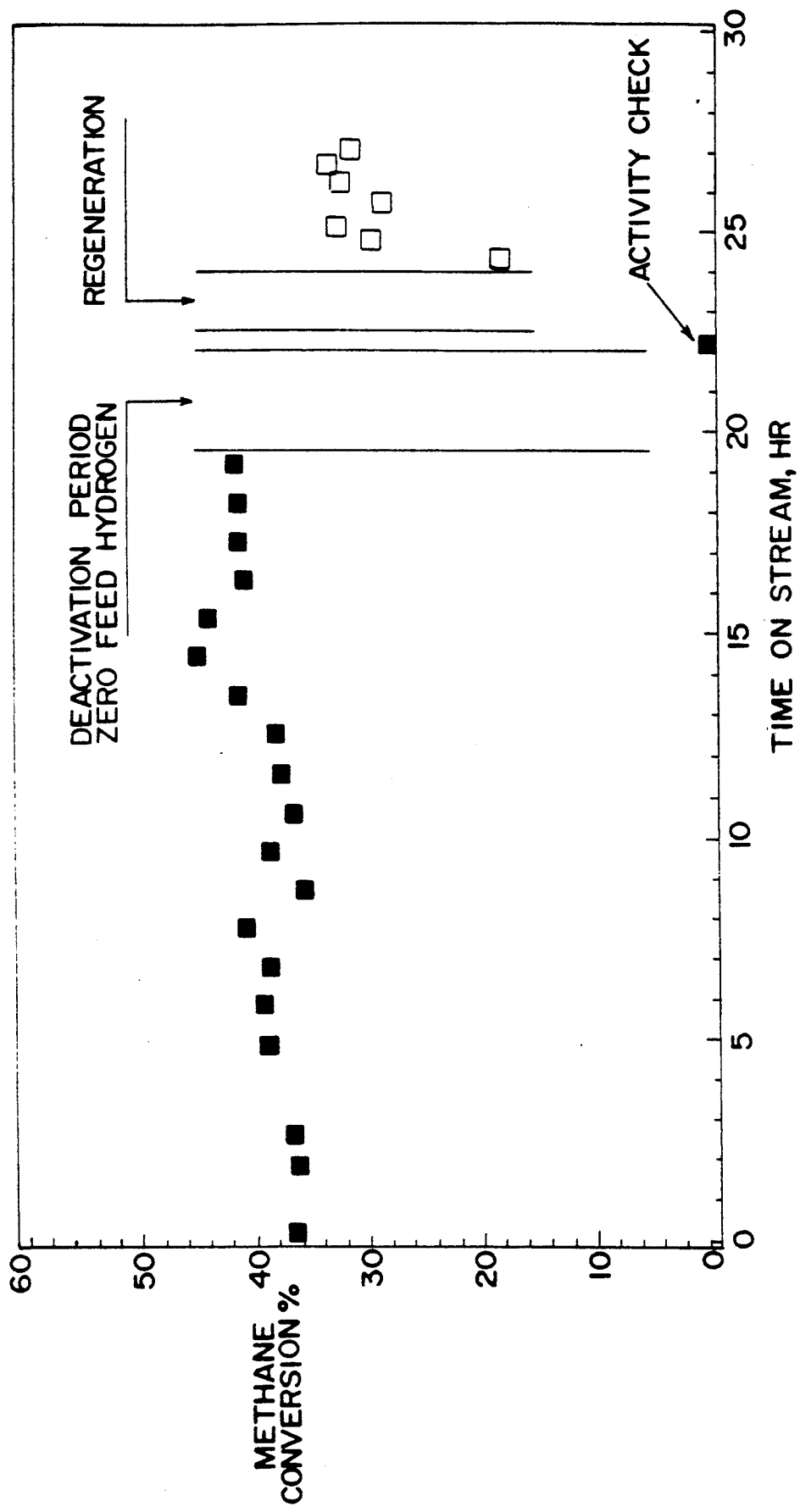
FIG. 2 is a graph of methane conversion versus time which shows the regeneration of a tungsten wire plasma initiator using air.

Methane/hydrogen mixture (1:4 mole ratio) flowing at 25 ml/min at atmospheric pressure was contacted with 1.5 gm of tungsten wire (about 0.03 inches in diameter and cut into 45 mm lengths) in the reactor of Example 1 and irradiated with microwave radiation centered at a 2.45 GHz frequency pulsed in an on/off cycle (0.14 seconds on in a total cycle of 3.5 seconds) with an average power of about 4.5 watts. As shown in FIG. 2, this resulted in average steady state methane conversion of 39.7%. After running for about 19.5 hours at this level of methane conversion, hydrogen flow was stopped and the initiators allowed to deactivate (by formation of carbon deposits) for about 2.5 hours. An activity check using a methane/hydrogen mixture (1:4 mole ratio) flowing at 25 ml/min showed that methane conversion was essentially zero. Carbonaceous deposits were also observed to have accumulated on the tungsten wires.

The flow of the methane/hydrogen mixture was then stopped and the reactor purged with air flowing at substantially greater than 100 ml/min. The initiators were then irradiated with microwaves in the manner described above for about 1.7 hours. Air was purged from the reactor using a methane/hydrogen mixture (1:4 mole ratio) and methane conversion calculated as above. FIG. 2 shows that methane conversion was restored to about 28%.

The data obtained in Examples 1 and 2 show that plasma initiators can be regenerated by contact with an oxygen-containing gas in the presence of microwave energy.

What is claimed is:

1. A method for regenerating a plasma initiator that has become at least partially deactivated due to the accumulation of carbonaceous deposits, sulfur deposits, or both thereon which comprises contacting the initiator with an oxygen-containing gas for a period of time sufficient to remove at least a portion of the deposits therefrom.

2. The method of claim 1 wherein the plasma initiator is a metal.

3. The method of claim 2 wherein the metal is tungsten, iron, nickel, copper, their alloys, or mixtures thereof.

4. The method of claim 3 wherein the metal is tungsten, iron or mixtures thereof.

5. The method of claim 1 wherein the plasma initiator is a non-metal other than silica.

6. The method of claim 5 wherein the non-metal is carbon, alumina, or mixtures thereof.

7. The method of claim 1 wherein the plasma initiator is a composite of a metal initiator and a non-metal initiator.

8. The method of claim 1 wherein a plurality of plasma initiators are regenerated.

9. The method of claim 1 wherein the regeneration is performed in the presence of microwave radiation having a frequency of at least 0.3 GHz.

10. The method of claim 9 wherein the frequency of the microwave radiation is centered around 0.915, 2.45, or 5.8 GHz.

11. A method of restoring at least a portion of the activity of a plasma initiator that has become at least partially deactivated due to the accumulation of carbonaceous deposits, sulfur deposits, or both thereon which comprises contacting the initiator with a gas containing from about 0.5 to about 30 mole % oxygen in the presence of microwave radiation having a frequency of at least 0.3 GHz for a period of time sufficient to remove at least a portion of the deposits therefrom.

12. The method of claim 11 wherein the restoring is conducted at a pressure greater than atmospheric pressure.

13. The method of claim 11 wherein at least one plasma initiator is a metal.

14. The method of claim 13 wherein the metal is tungsten, iron, nickel, copper, their alloys, or mixtures thereof.

15. The method of claim 14 wherein the metal is tungsten, iron or mixtures thereof.

16. The method of claim 11 wherein the plasma initiator is a non-metal other than silica.

17. The method of claim 16 wherein the non-metal is carbon, alumina, or mixtures thereof.

18. The method of claim 11 wherein at least one plasma initiator is a composite of a metal initiator and a non-metal initiator.

19. The method of claim 11 wherein the frequency of the microwave radiation is centered around 0.915, 2.45, or 5.8 GHz.

20. The method of claim 11 wherein the microwave energy is pulsed, with the duration of on time pulses ranging from 1 millisecond to about 10 seconds and the duration of off time pulses ranging from about 0.003 to about 60 seconds.

* * * * *